United States Patent [19]

Gambino

[11] Patent Number: 5,256,597
[45] Date of Patent: Oct. 26, 1993

[54] SELF-ALIGNED CONDUCTING ETCH STOP FOR INTERCONNECT PATTERNING

[75] Inventor: Jeffrey P. Gambino, Gaylordsville, Conn.

[73] Assignee: International Business Machines Corporation, Armonk, N.Y.

[21] Appl. No.: 941,346

[22] Filed: Sep. 4, 1992

[51] Int. Cl.$^5$ .......................................... H01L 21/44
[52] U.S. Cl. .................................. 437/189; 437/192; 437/194; 437/195; 156/628; 156/654; 156/656
[58] Field of Search ............... 437/189, 192, 194, 195, 437/197, 246, 228; 156/628, 654, 656; 257/758, 764, 765

[56] References Cited

U.S. PATENT DOCUMENTS

| 4,172,004 | 10/1979 | Alcorn et al. | 156/643 |
| 4,661,374 | 4/1987 | Doering | 156/656 |
| 4,668,335 | 5/1987 | Mockler et al. | 156/643 |
| 4,824,521 | 4/1989 | Kulkarni et al. | 156/643 |
| 4,873,204 | 10/1989 | Wong et al. | 437/200 |
| 4,920,071 | 4/1990 | Thomas | 437/188 |
| 4,925,524 | 5/1990 | Beatty | 156/643 |
| 4,960,489 | 10/1990 | Roeska et al. | 156/652 |
| 5,069,748 | 12/1991 | Przybysz | 156/643 |
| 5,081,065 | 1/1992 | Jonkers et al. | 437/200 |

OTHER PUBLICATIONS

Vossen, J., et al., Thin Film Processes, 1978, Academic Press, pp. 463-476.
"HPSAC-A Silicided Amorphous-Silicon Contact and Interconnect Technology for VLSI", by S. Wong, et al., IEEE Transactions on Electron Devices, vol. ED-34, No. 3, Mar. 1987.
"Titanium Silicide Interconnect Technology for Submicrometer DRAM's", by M. Fukumoto, et al., IEEE Transactions on Electron Devices, vol. 35, No. 12, Dec. 1988.
IBM Technical Disclosure Bulletin, vol. 13, No. 4, Sep. 1970, "Sputter etching Process", by W. E. Mutter.
IBM Technical Disclosure Bulletin, vol. 22, No. 10, Mar. 1980, "Chromium as an RIE Etch Barrier", by J. E. Hitchner, et al.

Primary Examiner—T. N. Quach
Attorney, Agent, or Firm—Richard Lau

[57] ABSTRACT

Process for fabricating an interconnect for a semiconductor structure, includes using a conductive etch stop layer. The conductive etch stop layer has etch selectivity to conductive interconnect material for protecting underlying features during etching. An interconnect is formed from the conductive interconnect material, and the conductive etch stop layer is caused to react with the interconnect for forming a metal alloy which electrically connects the interconnect with a structure.

13 Claims, 4 Drawing Sheets

SELF-ALIGNED CONDUCTING ETCH STOP FOR INTERCONNECT PATTERNING

FIELD OF THE INVENTION

The present invention relates generally to interconnects for semiconductor structures and, more particularly, to a self-aligned conducting etch stop for interconnect patterning.

BACKGROUND OF THE INVENTION

Present day high density integrated circuits require there to be a plurality of levels of metal interconnection between the various devices on a semiconductor chip. These metal interconnections include local interconnects or straps which connect together closely located devices, and also include global interconnects or metal lines which may connect together many circuits at various locations on a single chip. Generally, fabrication of metal interconnects involves deposition of a conductive layer over the devices to be connected, and etching of the conductive layer to form the interconnect between the devices. However, damaging underlying devices or structures during etching of the conductive layer has been a recurring problem during fabrication of metal interconnects.

Until recently, wet etching was widely used to pattern features, such as metal interconnects, in integrated circuits. Wet etching achieves the necessary high selectivity to underlying features for minimizing damage to these features. However, since wet etching is generally isotropic, it is very difficult to control dimensions of submicron features. Thus, reactive ion etching (RIE) is the preferred method for patterning of metal interconnects in advanced integrated circuits. RIE provides an anisotropic etch that is essential for controlling line widths of interconnects with dimensions of less than one micron. The problem with RIE is that the selectivity to underlying features is not always as high as required. This problem is accentuated as device dimensions become smaller. In this regard, as underlying layers become thinner the amount of overetching that can be tolerated is accordingly reduced.

Additionally, new circuit designs that increase device density make the problem increasingly difficult. One example is a partially covered contact. In this design, the area required by an interconnect layer is reduced by allowing the interconnects to only partially cover the contacts. Difficulties arise when the RIE overetch required to pattern the interconnect damages the contact. Thus, the yield of the device is reduced.

Several solutions to this problem, using etch stops, have been proposed. For instance, U.S. Pat. No. 4,960,489, to Roeska et al. discloses forming contacts on top of metal lines using an etch stop between the contact material and the underlying material. However, Roeska et al. requires that the underlying material be patterned along with the etch stop, i.e., the etch stop is not removed separately from the underlying material.

U.S. Pat. No. 4,925,524, to Beatty discloses using chromium as an etch stop. The chromium is removed with an $O_2/Cl_2$ plasma with high selectivity to $SiO_2$. However, it is known that silicon and certain other commonly used metals, such as aluminum, are etched by chlorine containing etches.

U.S. Pat. No. 4,668,335, to Mockler et al. relates to an aluminum reactive ion etching process that stops on a layer of TiW. The TiW layer is then removed with a wet etch. However, for submicron dimensions, lateral etching of the TiW by the wet etch may result in severe undercutting and undesirable lifting of the metal lines.

In the article entitled "HPSAC-A Silicided Amorphous-Silicon Contact and Interconnect Technology for VLSI", by Wong et al., *IEEE Transactions on Electron Devices*, vol. ED-34, No. 3, March, 1987, pages 587–591, a titanium etch stop layer is disclosed to pattern silicon lines. All of the silicon and titanium that are in contact with each other are converted to $TiSi_2$ by annealing. The unreacted titanium is then removed by a wet etch. The Wong et al. process has good selectivity to underlying layers and also has good line width control. However, the process is limited to the formation of silicides. In this regard, silicides have a relatively high resistivity. This is disadvantageous since interconnect delays are minimized by lowering of line resistance. Additionally, for local interconnects which can tolerate some degree of high resistivity because of short line lengths, the thickness of the silicide line is limited to that which is compatible with low junction leakage.

SUMMARY OF THE INVENTION

Generally, the present invention relates to a process for fabricating an interconnect for a semiconductor structure, which includes the steps of depositing a conductive etch stop layer on a structure, and depositing a conductor on the conductive etch stop layer. The conductive etch stop layer has etch selectivity to the conductor. Next, the conductor is etched, stopping on the conductive etch stop layer, so as to form an interconnect. The conductive etch stop layer is then caused to react with the interconnect so as to form a metal alloy. The metal alloy electrically connects the interconnect with the structure. Portions of the conductive etch stop layer not in contact with the interconnect do not react. Finally, the portions of the conductive etch stop layer which do not react are etched and removed.

BRIEF DESCRIPTION OF THE DRAWINGS

These and other objects, features, aspects and advantages will be more readily apparent and better understood from the following detailed description of the invention in which.

DETAILED DESCRIPTION OF THE PREFERRED EMBODIMENTS

Figure 1A:
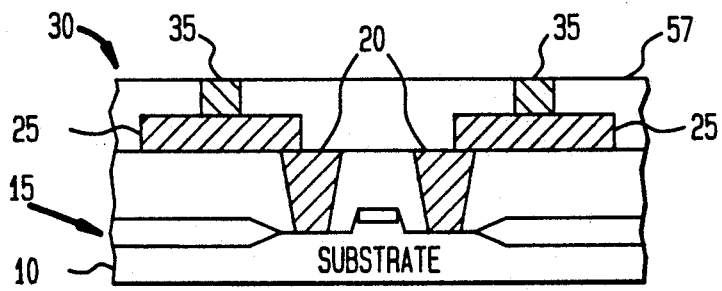
FIGS. 1A–1E are cross-sectional views illustrating consecutive process steps in the formation of second level metal lines in accordance with the present invention.
Figure 1B:
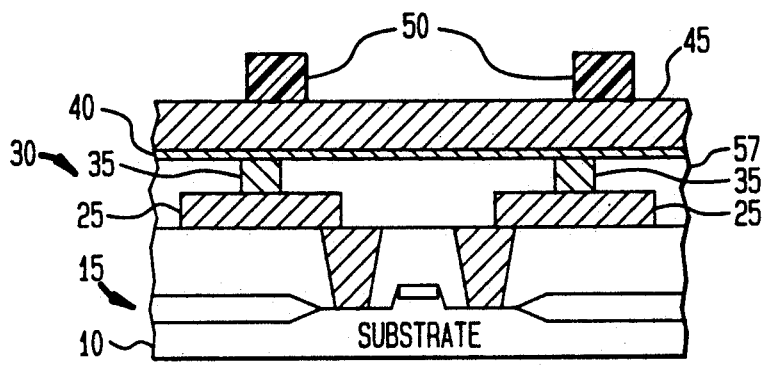
Figure 1C:
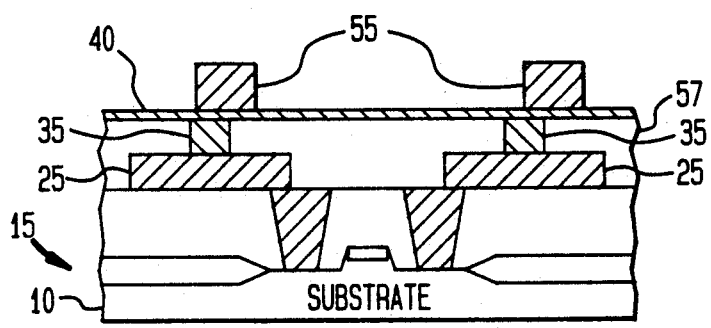

Referring initially to FIGS. 1A–E, there is shown a semiconductor substrate 10 having a device, such as a field-effect-transistor (FET) 15 formed thereon. Contact studs 20 connect the FET 15 to first level metal lines 25 of a first level metallization 30. As an example, the contact studs 20 can comprise tungsten, and the first level metal lines 25 can comprise aluminum. By way of example, the present invention will be discussed in connection with fabricating second level metal lines, or global interconnects, which connect to first level metal lines 25 by way of interlevel studs 35. As an example, the interlevel studs 35 can comprise aluminum.

In accordance with the invention, an etch stop layer 40 is deposited over the first level metallization 30, and a second level metal layer 45 is deposited over the first level metallization 30. The second level metal layer 45 should comprise a conductor suitable for forming metal lines and should have etch selective and reactive properties as outlined hereinbelow. For instance, such a conductor can comprise aluminum, titanium, metal silicides, or the like.

A photoresist mask 50, patterned for forming second level metal lines, is applied over the second level metal layer 45. The second level metal layer 45 is then etched, stopping at the etch stop layer 40, and thus forming second level metal lines 55. The etch technique used to etch the second level metal layer 45 to form the second level metal lines 55 is an anisotropic dry etch, preferably, a reactive ion etch (RIE).

It is important to realize that the etch stop layer 40 should have adequate etch selectivity to the second level metal layer 45 such that the etch stop layer 40 limits the RIE so as to only etch the second level metal layer 45, i.e., the etch stop layer 40 should etch at a considerably slower rate than does the second level metal layer 45. Further, the etch stop layer 40 should be of adequate thickness such that a continuous layer remains after the RIE. For instance, an etch stop layer having a thickness of 100-1000 Angstroms has been found to be sufficient. Thus, the etch stop layer 40 protects the underlying material, in this particular example, the interlevel studs 35 and insulating material 57, from being damaged during formation of the second level metal lines 55.

The specific material used for the etch stop layer 40 depends on the material being used to form the metal lines, and also depends on the etch technique being implemented. As examples, cobalt has been found to have adequate etch selectivity for use as the etch stop layer when forming metal lines from aluminum using a chlorine RIE; cobalt has also been found to have adequate etch selectivity for use as the etch stop layer when forming metal lines from titanium using a fluorine RIE. Other metals that can be used for the etch stop layer include platinum, gold, palladium, silver, copper, nickel, chromium, or the like.

Figure 1D:
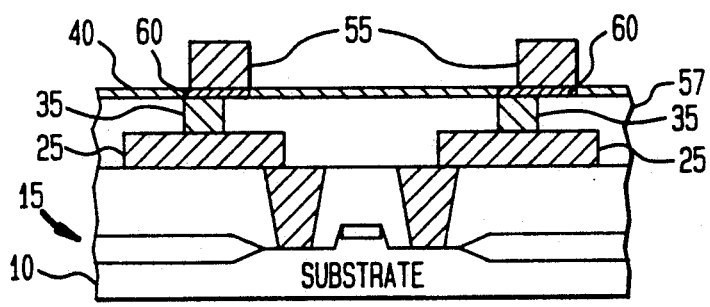
Figure 1E:
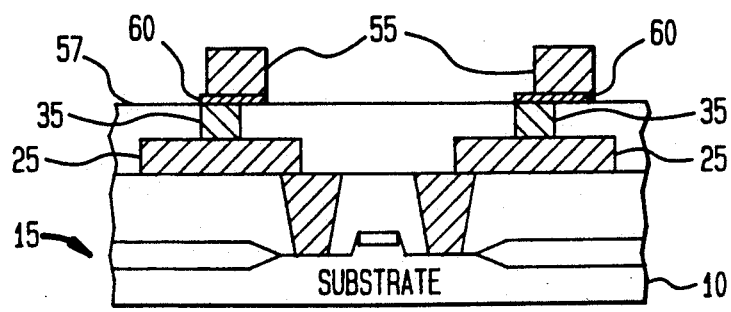
Figure 2A:
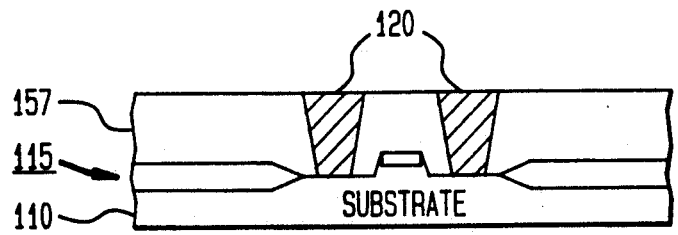
FIGS. 2A–2E are cross-sectional views illustrating consecutive process steps in the formation of first level metal lines in accordance with the present invention.
Figure 2B:
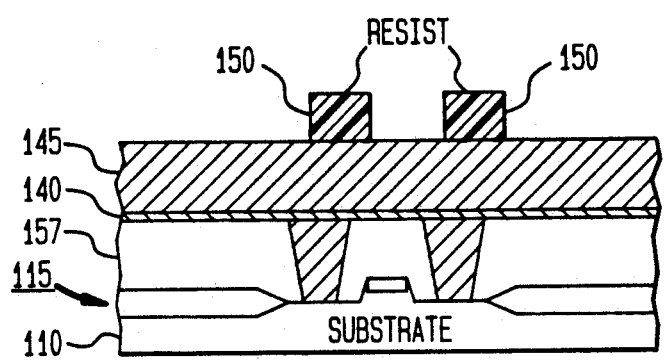
Figure 2C:
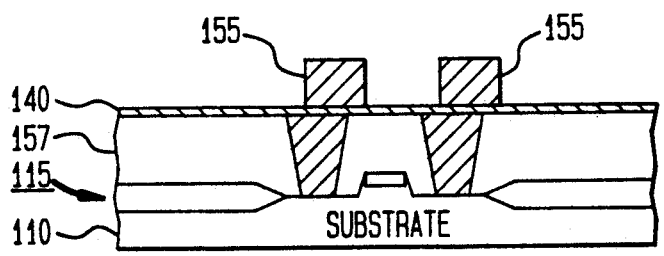
Figure 2D:
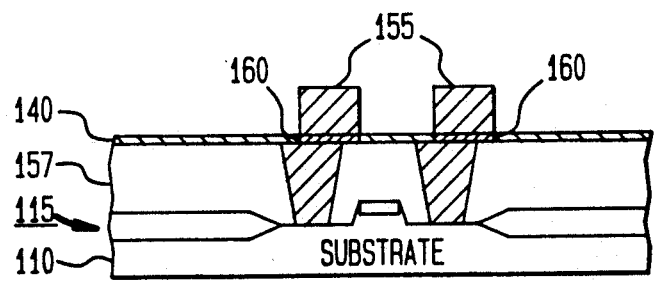
Figure 2E:
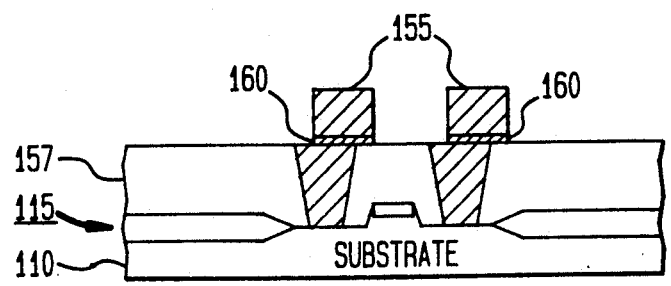
Figure 3A:
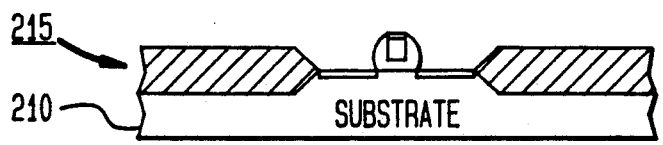
FIGS. 3A–3E are cross-sectional views illustrating consecutive process steps in the formation of a local interconnect in accordance with the present invention.
Figure 3B:
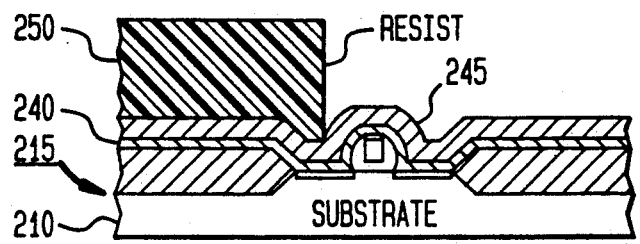
Figure 3C:
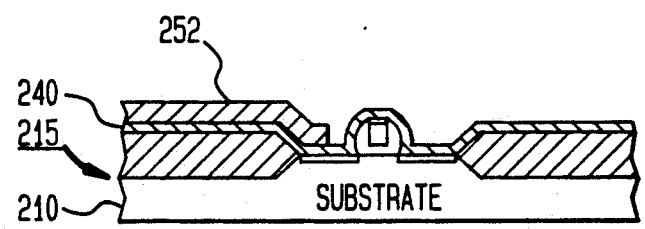
Figure 3D:
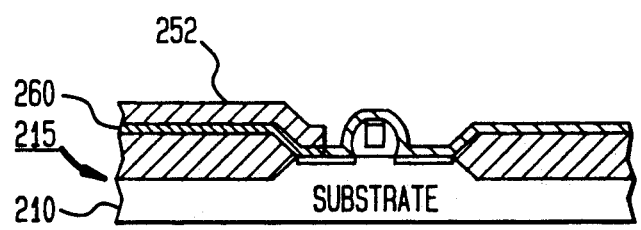
Figure 3E:
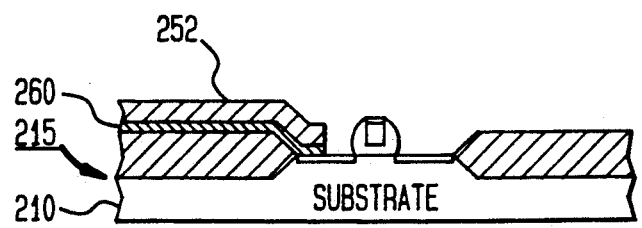
Figure 4A:
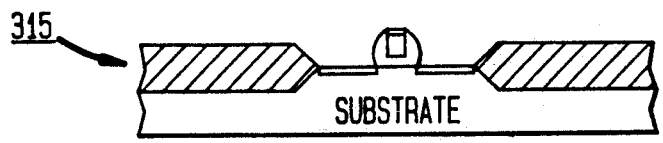
FIGS. 4A–4E are cross-sectional views illustrating consecutive process steps in the formation of an interconnect in which the interconnect is not reactive with an etch stop.
Figure 4B:
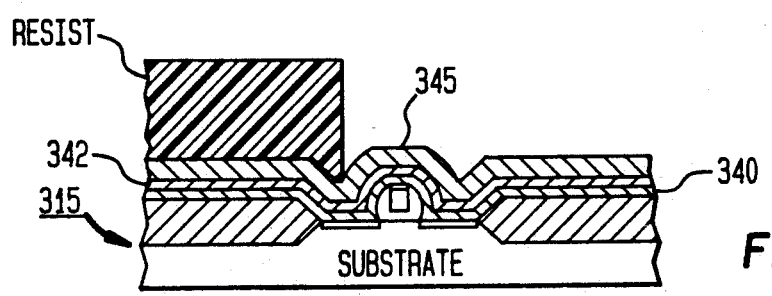
Figure 4C:
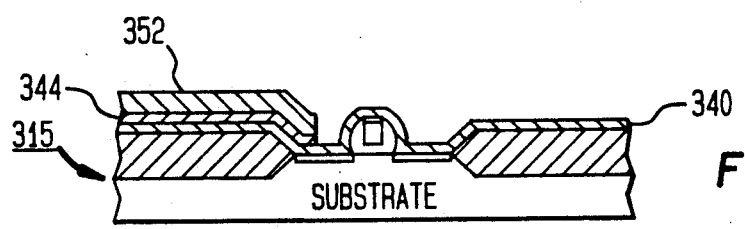
Figure 4D:
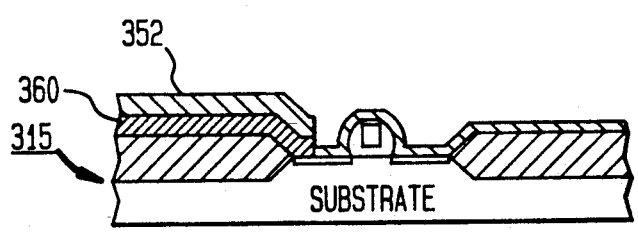
Figure 4E:
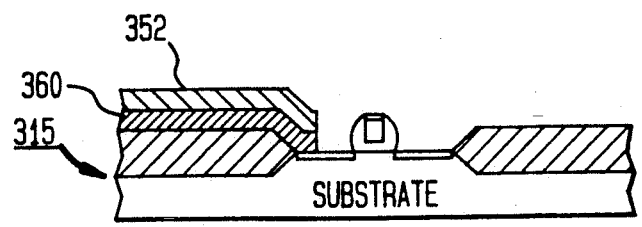

Additionally, the material used to form the etch stop layer 40 should be conductive, and should be reactive with the second level metal lines 55 for forming a metal alloy. In this regard, as a next step, the etch stop layer 40 is caused to react with the second level metal lines 55 (described hereinafter) so that the portions of the etch stop layer 40 which are in contact with the second level metal lines form a metal alloy 60. Moreover, as shown, if the interlevel studs 35 are also reactive with the etch stop layer 40, then the portions of the etch stop layer 40 which are in contact with the interlevel studs 35, although not in contact with the second level metal lines 55, also react so as to form the metal alloy 60. For instance, since aluminum is reactive with cobalt, if the interlevel studs 35 comprise aluminum and the etch stop layer 40 comprises cobalt, then the interlevel studs 35 would react with the etch stop layer 40 so as to form the metal alloy 60 as shown in FIG. 1D. Note that the interlevel studs 35 and the second level metal line 55 should be of adequate thickness so as to allow this reaction to occur, i.e., if the interlevel studs 35 and/or the second level metal lines 55 are too thin, then the reaction may not occur since there may not be sufficient amounts of metal for the metal alloy 60 to form. Thus, the metal alloy 60 electrically connects the second level metal lines 55 with the first level metal lines 25 via the interlevel studs 35. As a specific example, the metal alloy, $Co_2Al_9$, is formed by reacting cobalt with aluminum.

Annealing is a preferred method of causing the reaction between the etch stop layer 40 and the interlevel studs 35 and second level metal lines 55. A wide range of annealing parameters are adequate for reacting cobalt with aluminum. For example, annealing for 5-30 minutes at 400-600 degrees Celsius, or for 30-60 seconds at approximately 600 degrees Celsius have been found to be suitable. However, it should be understood that various other annealing parameters are also suitable for causing this reaction to occur.

As shown, the portions of the etch stop layer 40 which are not in contact with either the interlevel studs 35 or the second level metal lines 55 do not react to form a metal alloy. Preferably, a wet etch is used to remove these unreacted portions of etch stop layer 40. Generally, wet etching provides adequate selectivity between the etch stop layer 40 and the metal alloy 60, the second level metal lines 55 and any underlying layers, so that only the unreacted etch stop layer 40 is removed.

Advantageously, although the wet etch is isotropic, the metal alloy 60 is unaffected and will not be undercut by the wet etch. Thus, the metal alloy 60 protects the second level metal lines 55 from being removed by unintentional liftoff as a result of the wet etch. By way of specific examples, an etch stop layer of platinum, gold, or palladium can be patterned with an aqua regia wet etch, using titanium as the metal line; an etch stop layer of silver, gold, or nickel can be patterned with an $HNO_3:H_2O$ wet etch, using either aluminum or titanium as the metal line; and an etch stop layer of chromium can be patterned with an HCl, using titanium as the metal line. Performing the wet etch at a temperature of 25-50 degrees Celsius for 30 seconds to 5 minutes has been found to be suitable. Materials that adhere poorly to underlying insulating layer 57, which may comprise silicon dioxide, may only be usable as an adhesion layer.

Accordingly, it can thus be seen that formation of the metal alloy 60 is self-aligned to the interlevel studs 35 and the second level metal lines 55.

With reference to FIGS. 2A-E, the present invention will now be discussed in connection with formation of first level metal lines. A substrate 110 having a device, such as FET 115, formed thereon has contact studs 120 for connecting the FET 115 to first level metal lines. By way of example, the contact studs 120 comprise tungsten.

In accordance with the invention, an etch stop layer 140, such as cobalt, is deposited over the FET 115, and a first level metal layer 145, such as aluminum, is deposited over the etch stop layer 140. A photoresist mask 150, patterned for forming first level metal lines, is applied over the first level metal layer 145. The first level metal layer 145 is then etched using, for example, a RIE, stopping at the etch stop layer 140, and thus forming first level metal lines 155.

The etch stop layer 140 should have adequate etch selectivity to the first level metal layer 145 such that the etch stop layer 140 limits the RIE so as to only etch the first level metal layer 145, i.e., the etch stop layer 140 should etch at a considerably slower rate than does the first level metal layer 145. Thus, the etch stop layer 140 protects underlying material, in this particular example, the contact studs 120 and the insulating material 157, from being damaged during formation of the first level metal lines 155. As mentioned in the previous example, cobalt can be used as the etch stop layer 140 when forming metal lines from aluminum using a chloring RIE.

Next, the etch stop layer 140 is caused to react with the first level metal lines 155 so that the portions of the etch stop layer 140 which are in contact with the first level metal lines 155 form a metal alloy 160. The first level metal lines 155 should be of adequate thickness so as to allow the reaction to occur. In contrast to the previous example, note that in this example, since cobalt does not react well with tungsten, the portions of the etch stop layer 140 which are in contact with the contact studs 120, but not in contact with the first level metal lines 155, are shown as not reacting so as to form metal alloy. Thus, the metal alloy 160 electrically connects the first level metal lines 155 with the contact studs 120.

Annealing is a preferred method of causing the etch stop layer 140 to react with the first level metal lines 155. The annealing parameters for reacting cobalt with aluminum are discussed hereinabove.

The portions of the etch stop layer 140 which are not in contact with the first level metal lines 155 do not react to form a metal alloy. Preferably, a wet etch is used to remove these unreacted portions of the etch stop layer 140. The wet etch provides adequate selectivity between the etch stop layer 140 and the metal alloy 160, the first level metal lines 155 and the underlying layers, so that only the unreacted portions of the etch stop layer 140 is removed. The metal alloy 160 is unaffected and will not be undercut by the isotropic wet etch. Thus, the metal alloy 160 protects the first level metal lines 155 from being removed by unintentional liftoff as a result of the wet etch.

In this manner, the metal alloy 160 is self-aligned to the first level metal lines 155.

Referring now to FIGS. 3A-D, the present invention will be discussed in connection with formation of a local interconnect for a device, such as FET 215, formed on a substrate 210.

An etch stop layer 240, such as cobalt, is deposited over the FET 215, in conjunction with the topography of the FET 215. A metal layer 245, such as titanium, is deposited over the etch stop layer 240. A photoresist mask 250, patterned for forming a local interconnect, is applied over the metal layer 245. The metal layer 245 is then etched using, for example a RIE, stopping at the etch stop layer 240, and thus forming local interconnect 252.

The etch stop layer 240 has adequate etch selectivity to the metal layer 245 such that the etch stop layer 240 limits the RIE so as to only etch the metal layer 245, i.e., the etch stop layer 240 etches at a considerably slower rate than does the metal layer 245. Thus, the etch stop layer 240 protects the FET 215 from being damaged during formation of the local interconnect 252. Cobalt has been found to have adequate etch selectivity for use as the etch stop layer 240 when forming a local interconnect from titanium using a fluorine RIE.

Next, the etch stop layer 240 is reacted with the local interconnect 252 so that the portions of the etch stop layer 240 which are in contact with the local interconnect 252 form a metal alloy 260. The local interconnect 252 should be of adequate thickness so as to allow this reaction to occur. Thus, the metal alloy 260 allows the local interconnect 252 to electrically connect various areas of the FET 215. For instance, the local interconnect 252 may connect the diffusion of the FET 215 to the gate of a neighboring FET.

As above, annealing is a preferred method of reacting the etch stop layer 240 with the local interconnect 252.

The portions of the etch stop layer 240 which are not in contact with local interconnect 252 do not react to form a metal alloy. Preferably, a wet etch is used to remove these unreacted portions of etch stop layer 240. The wet etching provides adequate selectivity between the etch stop layer 240 and the FET 215 so that only the unreacted portions of the etch stop layer 240 are removed. The metal alloy 260 is unaffected by the isotropic wet etch and, thus, the protects the local interconnect 252 from being removed as a result of the wet etch.

In this manner, the metal alloy 160 is self-aligned to the local interconnect 252.

Referring now to FIGS. 4A-E, some fabrications may require formation of interconnects which do not react with an etch stop. For instance, tungsten metal lines do not react with cobalt etch stops. In such situations, a sacrificial alloying layer 342 which is reactive with the etch stop layer 340 is deposited between the etch stop layer 340 and the metal layer 345. For example, if the etch stop layer 340 comprises cobalt, then the sacrificial alloying layer 342 can comprise titanium. The metal layer 345 and the sacrificial alloying layer 342 are etched, and form an interconnect 352 and a sacrificial alloying portion 344, respectively. Annealing is then conducted to react the sacrificial alloying portion 344 with the etch stop layer 340. A metal alloy 360 is thus formed, and electrically connects the interconnect 352 with the device 315. The unreacted portions of the etch stop layer 340 are then removed.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A process for fabricating an interconnect for a semiconductor structure, comprising the steps of:

depositing a conductive etch stop layer on a structure;

depositing a sacrificial alloying layer on said conductive etch stop layer, and depositing an interconnect layer on the sacrificial alloying layer, said conductive etch stop layer having etch selectivity to said sacrificial alloying layer and said interconnect layer;

etching said sacrificial alloying layer and said interconnect layer, stopping on said conductive etch stop layer, so as to form an interconnect from said interconnect layer;

reacting said conductive etch stop layer with said sacrificial alloying layer so as to form a metal alloy which electrically connects said interconnect with said structure, wherein portions of said conductive etch stop layer not in contact with said interconnect do not react; and etching and removing the portions of said conductive etch stop layer which do not react.

2. A process according to claim 1, wherein a portion of the underlying structure comprises metal which reacts with said conductive etch stop layer to form a metal alloy.

3. A process according to claim 1, wherein said step of etching said sacrificial alloying layer and said interconnect layer comprises an anisotropic dry etch.

4. A process according to claim 3, wherein said anisotropic dry etch comprises a reactive ion etch.

5. A process according to claim 4, wherein said reactive ion etch utilizes chlorine.

6. A process according to claim 4, wherein said reactive ion etch utilizes fluorine.

7. A process according to claim 1, wherein said step of reacting said conductive etch stop layer comprises annealing.

8. A process according to claim 1, wherein said step of etching and removing the portion of said conductive etch stop layer comprises a wet etch.

9. A process according to claim 8, wherein said wet etch utilizes aqua regia.

10. A process according to claim 8, wherein said wet etch utilizes $HNO_3:H_2O$.

11. A process according to claim 8, wherein said wet etch utilizes HCl.

12. A process according to claim 8, wherein said wet etch utilizes $H_2SO_4$.

13. A process according to claim 1, wherein said conductive etch stop layer has a thickness of between 100-1000 Angstroms.

* * * * *